(12) United States Patent
Takeda et al.

(10) Patent No.: US 7,362,576 B2
(45) Date of Patent: *Apr. 22, 2008

(54) RADIO FREQUENCY MODULE

(75) Inventors: Eriko Takeda, Tokyo (JP); Atsushi Isobe, Kodaira (JP); Satoshi Tanaka, Kokubunji (JP); Hiroshi Okabe, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/076,938

(22) Filed: Mar. 11, 2005

(65) Prior Publication Data

US 2005/0151240 A1 Jul. 14, 2005

Related U.S. Application Data

(63) Continuation of application No. 10/302,813, filed on Nov. 25, 2005, now Pat. No. 6,879,488.

(30) Foreign Application Priority Data

Jan. 10, 2002 (JP) .............................. 2002-002934

(51) Int. Cl.
*H05K 7/20* (2006.01)
(52) U.S. Cl. ....................... 361/704; 174/252; 361/719
(58) Field of Classification Search ................ 174/252; 361/704, 719
See application file for complete search history.

(56) References Cited

U.S. PATENT DOCUMENTS 4,739,448 A 4/1988 Rowe et al.

| | | | |
|---|---|---|---|
| 6,201,701 B1 * | 3/2001 | Linden et al. | 361/720 |
| 6,205,028 B1 | 3/2001 | Matsumura | |
| 6,351,194 B2 | 2/2002 | Takahashi et al. | |
| 6,633,005 B2 | 10/2003 | Ichitsubo et al. | |
| 6,657,523 B2 | 12/2003 | Tarui et al. | |

FOREIGN PATENT DOCUMENTS

| JP | 7-147349 | 6/1995 |
|---|---|---|
| JP | 07-297363 | 11/1995 |
| JP | 7-321423 | 12/1995 |
| JP | 1996-102631 | 4/1996 |
| JP | 9-8584 | 1/1997 |
| JP | 9-27570 | 1/1997 |

(Continued)

*Primary Examiner*—Gregory Thompson
(74) *Attorney, Agent, or Firm*—Mattingly, Stanger, Malur & Brundidge, P.C.

(57) ABSTRACT

In a compact radio frequency module, a first chip forms a heater element and a second chip forms a device whose operating characteristics vary with temperature change or whose maximum operating temperature is lower than the maximum operating temperature of the first chip. A multilayer substrate has a plurality of dielectric layers and a plurality of conductor layers and mechanically supports the first chip and the second chip with some of the conductor layers electrically connected with these chips. The module can conduct the heat generated by the first chip throughout the module; guide the heat generated by the first chip from the module's top face side to its bottom face side; and interrupt the heat conduction from the first conductor pattern on which the first chip is placed to the second conductor pattern on which the second chip is placed.

17 Claims, 10 Drawing Sheets

FOREIGN PATENT DOCUMENTS

| | | |
|---|---|---|
| JP | 9-283700 | 10/1997 |
| JP | 09-293802 | 11/1997 |
| JP | 10-256677 | 9/1998 |
| JP | 1999-121640 | 4/1999 |
| JP | 11-266546 | 9/1999 |
| JP | 2000-183679 | 6/2000 |
| JP | 2001-127652 | 5/2001 |

* cited by examiner

RADIO FREQUENCY MODULE

This is a continuation application of U.S. Ser. No. 10/302,813, filed Nov. 25, 2005 now U.S. Pat. No. 6,879,488.

BACKGROUND OF THE INVENTION

1. Field of the Invention

The present invention relates to wireless communications and particularly to radio frequency components for use in mobile communication terminals such as mobile phones and wireless communication terminals such as wireless LAN, which feature increased function, high integration, reduced size and low price.

2. Description of the Related Art

With the growing tendency towards more compact wireless communication terminals, there is demand for radio frequency components for wireless communication terminals that fit into a smaller packaging area. Conventionally, circuit of radio frequency parts have been divided into several blocks by function and the blocks have been manufactured separately as modules while efforts have been made to improve reliability, reduce size and increase integration for each module. For example, methods of heat dissipation in power amplifier (hereinafter referred to as PA) modules including power amplifiers as heater elements are disclosed in JP-A No. 27570/1997 and JP-A No. 147349/1995.

In recent years, JP-A No. 8584/1997 and JP-A No. 266546/1999 disclose techniques which produce more compact radio frequency components with higher integration in function by combining modules which would be separately manufactured in the former methods.

PA requires a heat dissipation structure because it consumes much electric power and generates heat. For this reason, various PA module structures for effective heat dissipation are disclosed: one example is a multilayer substrate which has, on its surface layer, an electrically isolated metallized layer or a metallized layer connected to a grounding layer (JP-A No. 147349/1995) and another example concerns a structure of a substrate in which the almost whole surface of the ceramic substrate is covered with a metal layer and through holes for heat dissipation are uniformly distributed almost all over the substrate (JP-A No. 27570/1997).

However, these conventional techniques have the following drawback: in a module which integrates a power amplifier and a device whose operating characteristics vary with rise in temperature, namely a device having sensitive temperature dependence of characteristics, on a substrate, the influence of the heat generated by the PA on the device having sensitive temperature dependence of characteristics is not taken into consideration, or though it is taken into consideration to mount a PA and a device having sensitive temperature dependence of characteristics together in a module, attention is not paid to the fact that part of the heat is conducted in the module substrate and then to the above-said device having sensitive temperature dependence of characteristics.

Therefore, in the conventional techniques, when a device having sensitive temperature dependence of characteristics is mounted together with a power amplifier on a substrate, the fair distance between both the devices was needed to avoid the influence of the heat generated by the power amplifier. Furthermore, a deterioration in electrical characteristics which is caused by change in characteristics with temperature rise has been unavoidable. For this reason, it has been impossible to produce a compact, high performance radio frequency module in the form of both a power amplifier, which generates heat, and a device having sensitive temperature dependence of characteristics are mounted together.

SUMMARY OF THE INVENTION

The present invention introduces a new concept of suppressing temperature rise in the part of a substrate where the above-mentioned device having sensitive temperature dependence of characteristics is placed for a radio frequency module where a power amplifier and the device having sensitive temperature dependence of characteristics are integrated, thereby solving the above problem and realizing a compact, high-performance radio frequency module.

The present invention focuses the structure of a radio frequency module which solves the above problem and particularly the arrangement of conductor layers.

According to one aspect of the present invention, a radio frequency module comprises at least: a first chip forming a heater element; a second chip forming a device whose operating characteristics vary with temperature change or whose maximum operating temperature is lower than the maximum operating temperature of the first chip; and a multilayer substrate which is comprised of a plurality of dielectric layers and a plurality of conductor layers and mechanically supports the first chip and the second chip with some of the conductor layers electrically connected with these chips, wherein the first chip is located on a conductor layer provided on the top face of the multilayer substrate or on a first conductor pattern made on a conductor layer inside a cavity made in the multilayer substrate; the second chip is located on a conductor layer provided on the top face of the multilayer substrate or on a second conductor pattern made on a conductor layer inside a cavity made in the multilayer substrate; and when the multilayer substrate is fixed on another substrate, it is fixed with its bottom face in contact with the other substrate, and the module has at least one of the following means: means for conducting the heat generated by the first chip throughout the module; means for guiding the heat generated by the first chip from the module's top face to its bottom face; and means for interrupting heat conduction from the first conductor pattern to the second conductor pattern.

According to another aspect of the invention, a radio frequency module comprises at least: a first chip forming a heater element; a second chip forming a device whose operating characteristics vary with temperature change or whose maximum operating temperature is lower than the maximum operating temperature of the first chip; and a multilayer substrate which is comprised of a plurality of dielectric layers and a plurality of conductor layers and mechanically supports the first chip and the second chip with some of the conductor layers electrically connected with these chips, wherein the first chip is located on a conductor layer provided on the top face of the multilayer substrate or on a first conductor pattern made on a conductor layer inside a cavity made in the multilayer substrate; the second chip is located on a conductor layer provided on the top face of the multilayer substrate or on a second conductor pattern made on a conductor layer inside a cavity made in the multilayer substrate; and when the multilayer substrate is fixed on another substrate, it is fixed with its bottom face in contact with the other substrate and the first conductor pattern and another conductor pattern electrically connected with the first conductor pattern are isolated from the second conductor pattern and another conductor pattern electrically connected with the second conductor pattern at the conductor layer in which the second conductor pattern is formed and conductor layers closer to the top face of the multilayer substrate than the conductor layer in which the second conductor pattern is formed.

According to a further aspect of the invention, the first conductor pattern and another conductor pattern electrically connected with the first conductor pattern are isolated from the second conductor pattern and another conductor pattern electrically connected with the second conductor pattern at the conductor layer in which the second conductor pattern is formed and conductor layers closer to the top face of the multilayer substrate than the conductor layer in which the second conductor pattern is formed and the former conductor patterns are connected with the latter ones at least at one of the conductor layers located closer to the bottom face of the multilayer substrate than the conductor layer in which the second conductor pattern is formed.

According to a further aspect of the invention, a radio frequency module comprises a first chip; a second chip whose heat value per unit time may be smaller than that of the first chip; and a multilayer substrate comprised of a plurality of conductor layers and a plurality of dielectric layers, wherein the first chip and the second chip are electrically connected with any of the conductor layers, and there are a first structure for conducting the heat generated by the first chip horizontally in the module and a second structure for conducting the heat vertically in the module.

A conductor layer may be used for the first structure. The conductor layer can conduct the heat generated by the first chip horizontally. When the conductor layer extends to the substrate's outer edge area, it realize easier heat conduction in a substrate. One approach to controlling the heat conductivity of the conductor layer is to cut off patterns in the conductor layer. To this end, part of the conductor layer may be removed or a groove may be made.

The first chip, for example a power amplifier, does not always generate heat but turns on and off periodically in some cases. The primary object of the invention is to prevent the second chip from being affected by the heat generated by the first chip which is operating.

According to a further aspect of the invention, as a method for preventing heat conduction from the first chip to the second chip, a heat isolation zone which crosses the line connecting the first chip and the second chip is specified on the main surface of the multilayer substrate and the conductor layer area corresponding to the projection from the heat isolation zone is removed or a groove is made in the area corresponding to the projection from the heat isolation zone. The conductor layer area corresponding to the projection from the heat isolation zone may be removed in all the conductor layers or in a single conductor layer. Also, the whole area corresponding to the projection or part of the area may be removed.

One example of the second structure is a via hole.

To put the first chip and the second chip at the different conductor layer each other is effective to reduce the thermal effect to the second chip, because the distance between the first chip and the second chip becomes longer than that in case of mounting them on the same layer.

According to the present invention, even when a first device which has a power amplifying function and a second device which has sensitive temperature dependence of characteristics such as a surface acoustic wave device (hereinafter referred to as a "SAW" device) are integrated on a substrate, the temperature rise of the area in which the second device is placed can be suppressed and its thermal interference with the first device can be reduced so that it is possible to provide a compact radio frequency module with higher integration in function which allows the first device and the second device to operate normally and stably.

The use of a radio frequency module according to the present invention enables to realize of a more compact wireless communication terminal or if the size of a wireless communication terminal is fixed, it offers more space for new additional functions.

BRIEF DESCRIPTION OF THE DRAWINGS

The invention will be more particularly described with reference to the accompanying drawings, in which.

DETAILED DESCRIPTION OF THE PREFERRED EMBODIMENTS

Next, preferred embodiments of the present invention will be described in detail referring to the accompanying drawings. In the figures which illustrate the embodiments, components which have the same functions are designated by the same reference numerals and components which are once explained will not be explained again.

Figure 1:
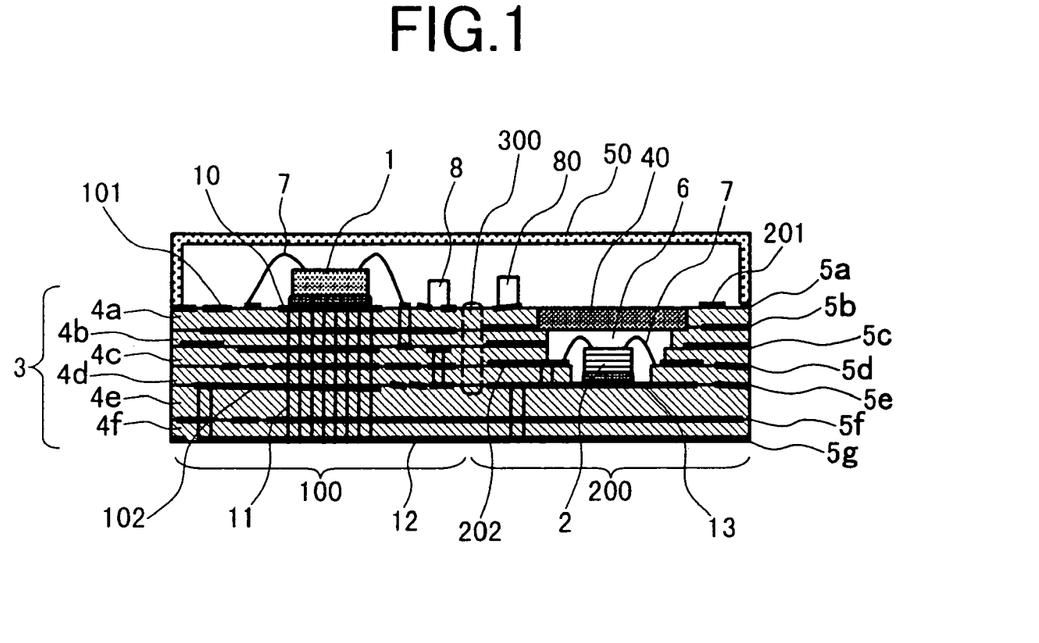
FIG. 1 is a sectional view showing a first embodiment of the present invention.

FIG. 1 is a sectional view showing a radio frequency module according to a first embodiment of the present invention. The first embodiment is a radio frequency module in which a power amplifier 1 and a SAW device 2 ( ) are mounted on a ceramic multilayer substrate 3. The SAW device 2 in this embodiment has a function as a transmitting filter. The multilayer substrate 3 is composed of six dielectric layers 4a, 4b, 4c, 4d, 4e, 4f and seven conductor layers 5a, 5b, 5c, 5d, 5e, 5f, 5g. According to the first embodiment, the power amplifier 1 is mounted by silver paste or solder on a conductor pattern 10 formed on the conductor layer 5a. The SAW device 2 is mounted by silver paste or solder on a conductor pattern 13 formed on the conductor layer 5e inside a cavity 6 made by partially removing the dielectric layers 4a to 4d. The conductor pattern on the surface of each device and the relevant conductor layer of the multilayer substrate are connected by bonding wires 7. The cavity, in which the SAW device 2 is located, is hermetically sealed by a cover 40. With a passive device 8 and the like on the top face of the multilayer substrate, the substrate top is covered by a lid 50.

In this embodiment, the multilayer substrate 3 has two areas: a first area 100 and a second area 200. The first area 100 includes the power amplifier 1, the passive device 8 for its operation, a wiring pattern 101 which connects them, and a conductor pattern 102 which serves as the ground for the power amplifier 1; the second area 200 includes the SAW device 2 and a passive device 80 for its operation, a wiring pattern 201 which connects them and a conductor pattern 202 which serves as the ground for the SAW device 2.

The heat generated by the power amplifier 1 is conducted partially from the module surface and partially through the conductor pattern 10 holding the power amplifier 1, then through conductor layers and dielectric layers or via holes 11 down to the bottom face 12 of the module while being conducted horizontally and vertically. From the bottom face 12, the heat goes, for example, through a motherboard (not shown) on which the module is mounted, before being forced out of the module (for example, dissipated into the air).

In the present invention, the SAW device 2, which has sensitive temperature dependence of characteristics, and the power amplifier 2 are integrated on the same multilayer substrate 3 so it is necessary to minimize temperature rise of the conductor pattern 13 holding the SAW device 2 in order to prevent or reduce the possibility of deterioration in the SAW device 2.

For this purpose, preferably the module should have either of the following structures or a combination of them: one structure is such that the heat is conducted throughout the module to reduce rise in the overall temperature of the module; another structure is such that the heat can easily emanate from the conductor pattern 10 holding the power amplifier 1 or from the conductor pattern 13 holding the SAW device; and a further structure is such that the heat from the power amplifier 1 is hardly transferred to the conductor pattern holding the SAW device 2.

In the first embodiment of the present invention, in order to facilitate heat conduction inside the module, as many conductors as possible are provided in each of the first area 100 and the second area 200. In the first embodiment there is an area 300 where conductors are not connected between the area 100 and the area 200 at the following conductor layers; conductor layers between the conductor layer in which the conductor pattern 13 is formed and the conductor layer in which the conductor pattern 10 is formed, namely conductor layer 5a, 5b,5c,5d and 5e. Therefore, as the heat conducted from the conductor pattern 10 passes mainly through conductors or via holes 11 and enters the first area 100, the heat conductivity becomes low in the area 300 and the heat is hardly conducted into the second area 200. As a result, the amount of heat which is conducted into the second area 200 decreases. Also in the second area 200, as many conductors as possible are provided in order to conduct the incoming heat throughout the second area 200. Therefore, the amount of heat which is conducted to the conductor pattern 13 holding the SAW device 2 decreases so that the temperature rise of the conductor pattern 13 can be suppressed, resulting in a reduction in the temperature rise of the SAW device 2.

Consequently, even when the power amplifier 1 and SAW device 2 are integrated into one module, the SAW device 2 can operate with stability.

Figure 2:
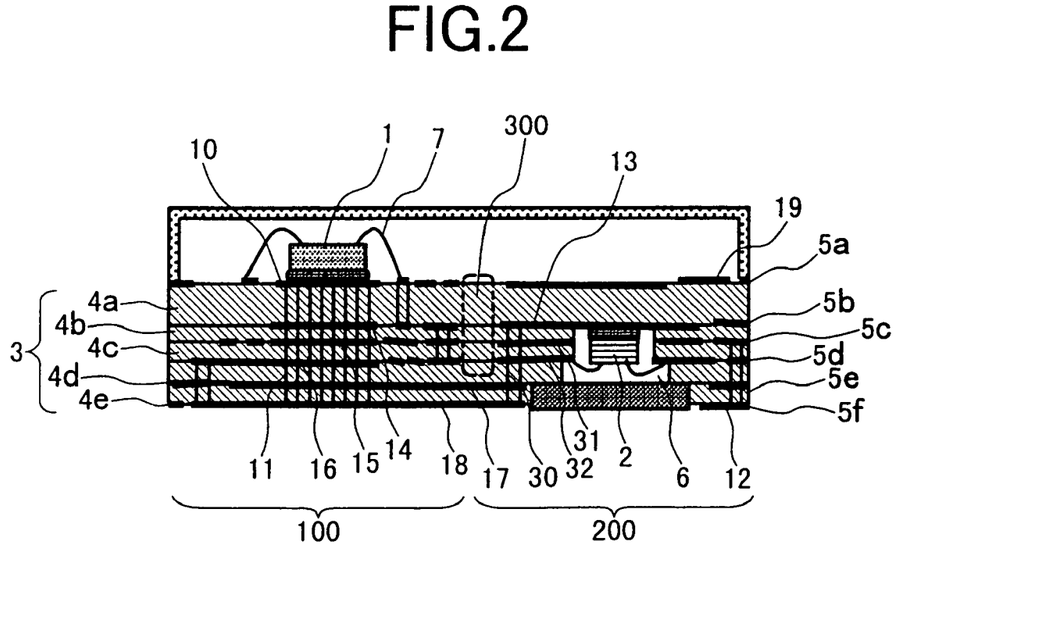
FIG. 2 is a sectional view showing a second embodiment of the present invention.

Next, a second embodiment of the present invention is described referring to FIG. 2. FIG. 2 is a sectional view showing a radio frequency module according to the second embodiment. The structure of the second embodiment is the same as that of the first embodiment except that the multilayer substrate 3 is composed of five dielectric layers and six conductor layers and a cavity in which the SAW device 2 is located extends from the dielectric layer 4b to the dielectric layer 4e.

In this embodiment, a conductor pattern electrically connected with the conductor pattern 10 holding the power amplifier 1 is connected with another conductor pattern electrically connected with the conductor pattern 13 holding the SAW device 2 at the conductor layers 5e and 5f which are located below the conductor pattern 13. Between the conductor layers 5a to 5d, there is an area 300 in which the conductor pattern 10 holding the power amplifier 1 and the other conductor pattern electrically connected with the conductor pattern 10 are not connected with the conductor pattern 13 holding the SAW device 2 and the other conductor pattern electrically connected with the conductor pattern 13.

Figure 3A:
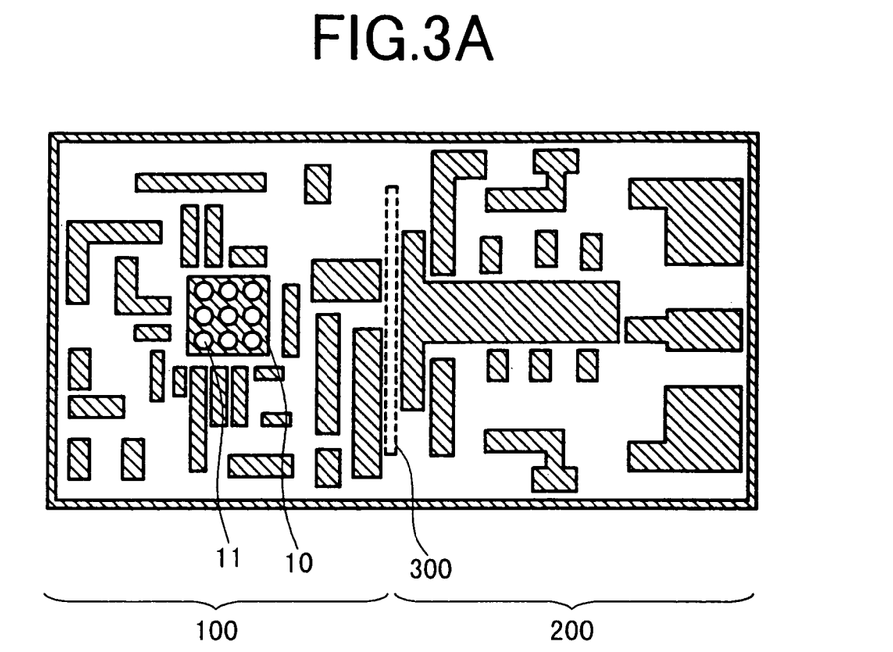
FIG. 3A is a top view showing a conductor pattern on a conductor layer 5$a$ according to the second embodiment of the present invention and FIG. 3B is a top view showing a conductor pattern on a conductor layer 5$b$ according to the second embodiment of the present invention.
Figure 3B:
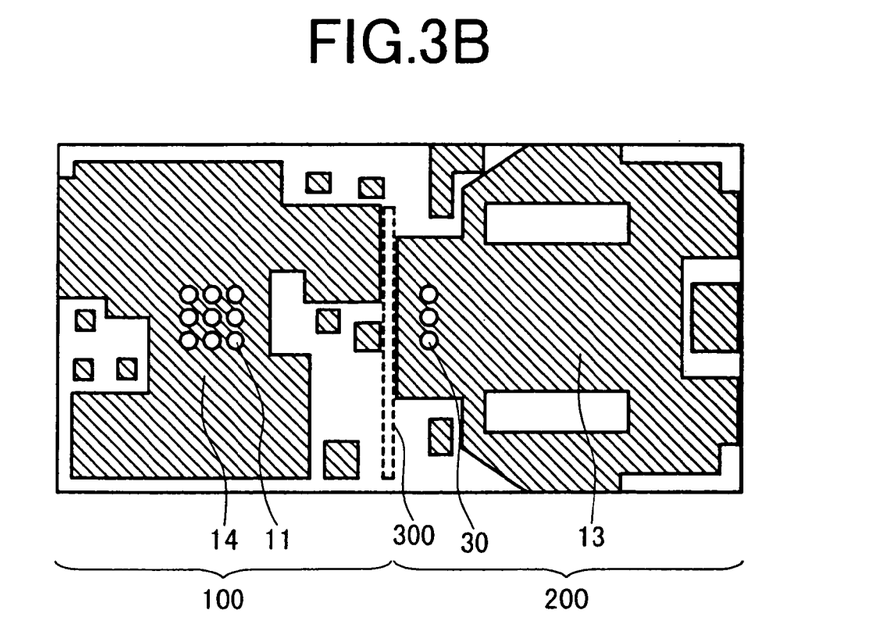
Figure 4A:
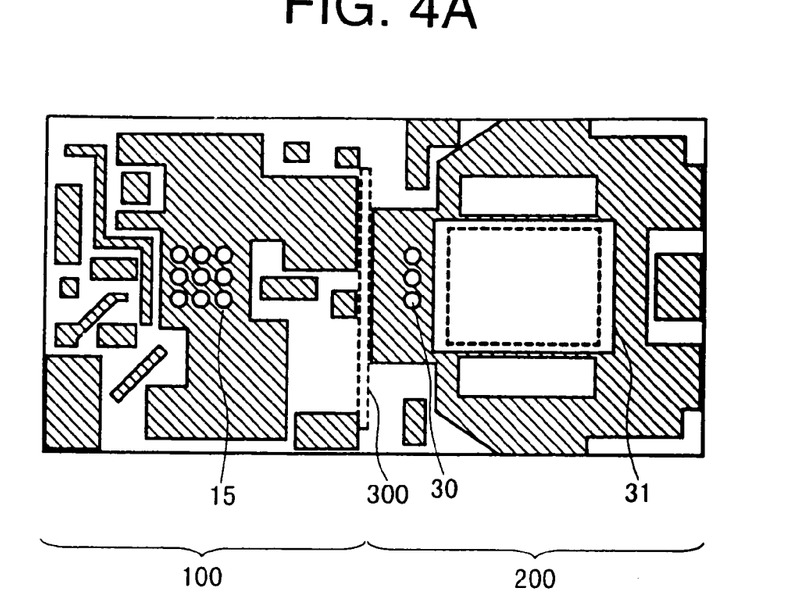
FIG. 4A is a top view showing a conductor pattern on a conductor layer 5$c$ according to the second embodiment of the present invention and FIG. 4B is a top view showing a conductor pattern on a conductor layer 5$d$ according to the second embodiment of the present invention.
Figure 4B:
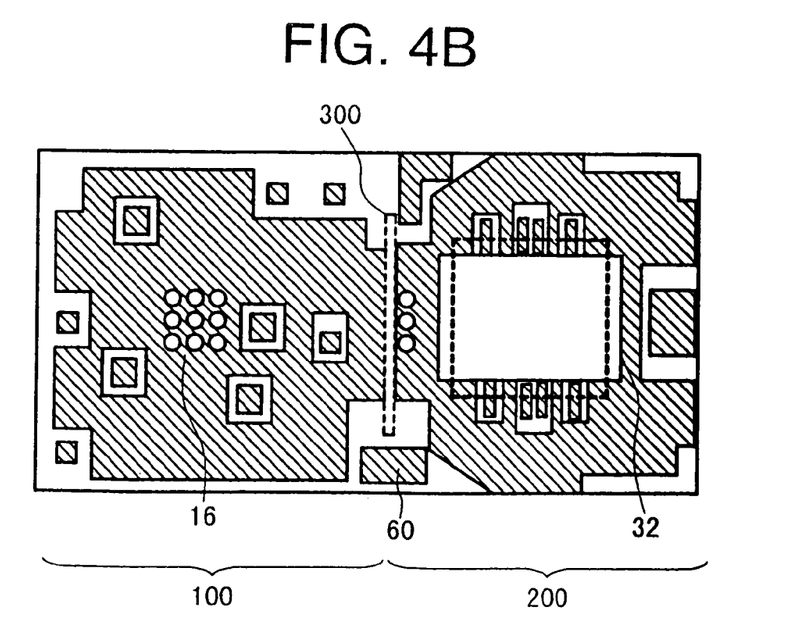
Figure 5A:
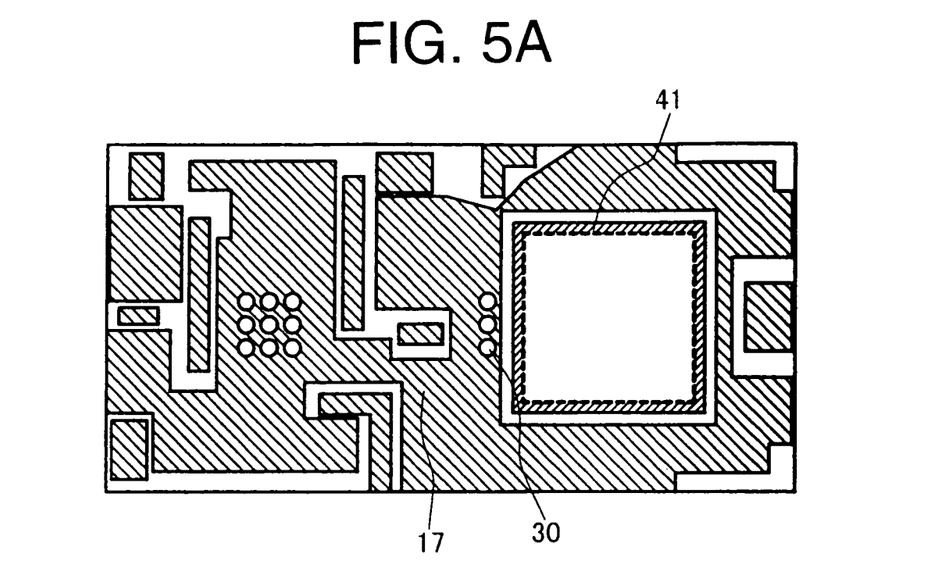
FIG. 5A is a top view showing a conductor pattern on a conductor layer 5$e$ according to the second embodiment of the present invention and FIG. 5B is a top view showing a conductor pattern on a conductor layer 5$f$ according to the second embodiment of the present invention.
Figure 5B:
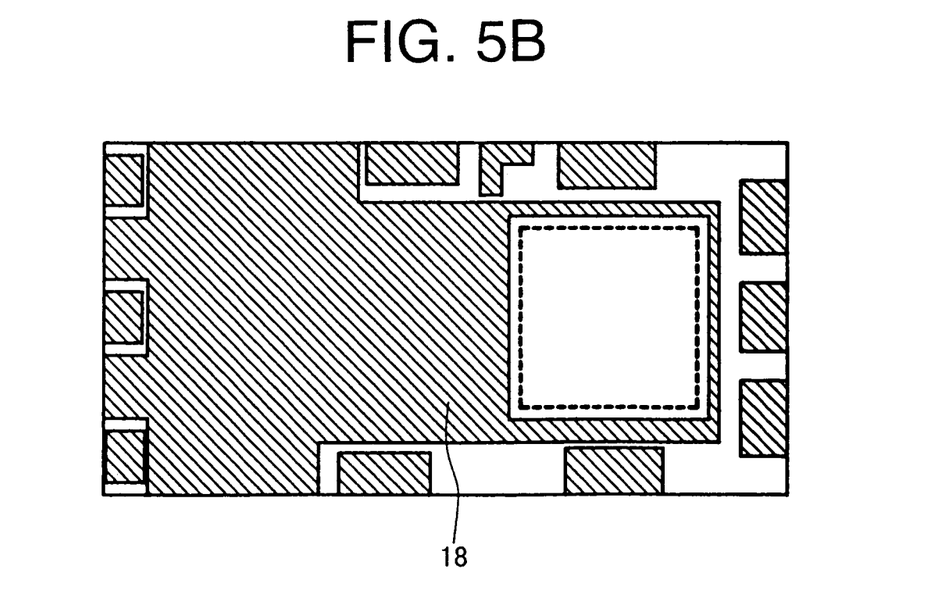

FIGS. 3A to 5B respectively show the respective conductor patterns on the conductor layers 5a to 5f. The power amplifier 1 is mounted on the conductor pattern 10 as shown in FIG. 3A and the heat generated by the power amplifier 1 is conducted through conductor patterns (shown in FIG. 3A to FIG. 5B) horizontally or mainly through the via holes 11 vertically. In this embodiment, the power amplifier is held by the conductor pattern 10 (as shown in FIG. 3A) while the SAW device 2 is held by the conductor pattern 13 (as shown in FIG. 3B). The module is designed so that the conductor pattern 14 (FIG. 3B), conductor pattern 15 (FIG. 4A) and conductor pattern 16 (FIG. 4B), which are electrically connected through the via holes 11 to the conductor pattern 10, are not connected with the conductor pattern 31 (FIG. 4A) and conductor pattern 32 (FIG. 4B) which are electrically connected through via holes 30 to the conductor pattern 13 holding the SAW device, at the same layer level. On the other hand, as shown in FIGS. 5A and 5B, the conductor pattern electrically connected with the conductor pattern 10 and the conductor pattern electrically connected with the conductor pattern 13 are connected with each other at the conductor layers 5e and 5f, by a conductor pattern 17 and a conductor pattern 18, respectively.

As a consequence, the heat generated by the power amplifier 1 is hardly conducted to the conductor layer 5b holding the SAW device 2 and the conductor layers located adjacent to it, 5a, 5c and 5d, which curbs the temperature rise of the conductor pattern 13 and enables the SAW device 2 to operate with stability.

The wiring which carries signals from the power amplifier 1 to the SAW device 2 crosses the boundary zone between the first area 100 to the second area 200 through a wiring pattern 60 provided on the conductor layer 5d as shown in FIG. 4B. The area of wiring which carries signals from the power amplifier 1 to the SAW device 2 is smaller than that of the conductor patterns 10 and 14 and thus the amount of heat which is conducted from the first area 100 to the second area 200 is smaller. Accordingly, the influence of the heat conducted through the wiring pattern 60 on the SAW device 2 is not considerable so the wiring pattern 60 need not always be provided on the conductor layer 5d; instead it may be provided on a layer above or below the conductor layer 5d.

Therefore, even when the power amplifier 1 and SAW device 2 are mounted on the same multilayer substrate 3, the adoption of the structure as defined by the present invention reduces the influence of the heat generated by the power amplifier 1 on the SAW device 2, so it is possible to provide a radio frequency module which allows the SAW device 2 to operate with stability even when both the devices are densely integrated in the substrate.

Figure 6:
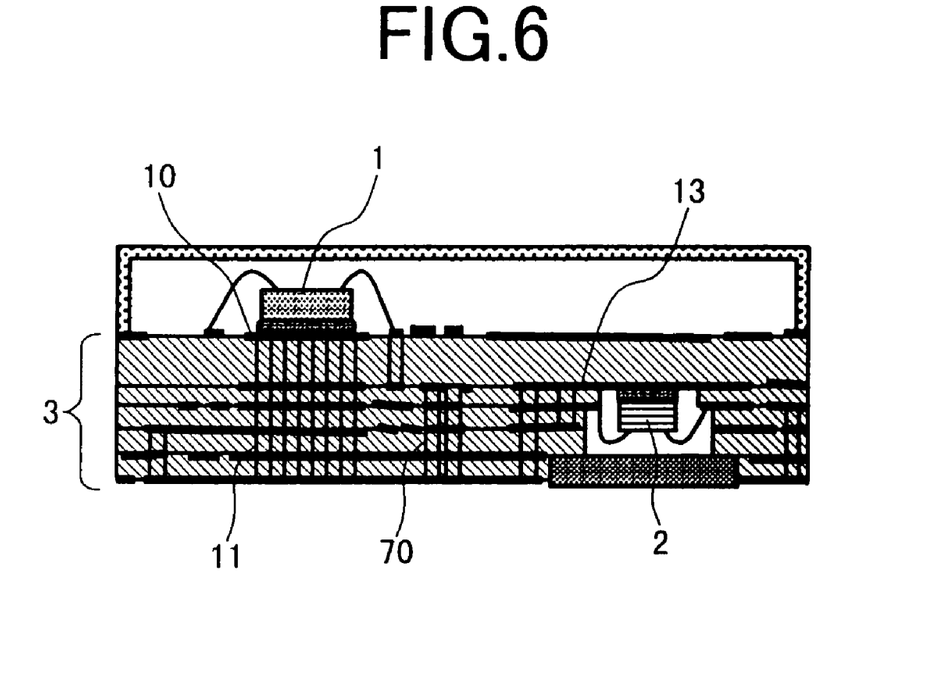
FIG. 6 is a sectional view showing a third embodiment of the present invention.

Next, a third embodiment of the present invention is described, referring to FIG. 6. FIG. 6 is a sectional view showing the third embodiment. The structure of the radio frequency module in the third embodiment is the same as that in the second embodiment except that via holes 70 are provided between the conductor pattern 10 holding the power amplifier 1 and the conductor pattern 13 holding the SAW device 2, in addition to the via holes 11 located beneath the power amplifier 1. These via holes 70 further encourage the heat to be conducted vertically, thereby decreasing the amount of heat to be conducted towards the conductor pattern 13 holding the SAW device 2. As a consequence, the influence of the heat generated by the power amplifier 1 on the SAW device 2 is reduced so it is possible to provide a radio frequency module which allows the SAW device 2 to operate with stability even when both the devices are densely integrated in the substrate.

Figure 7:
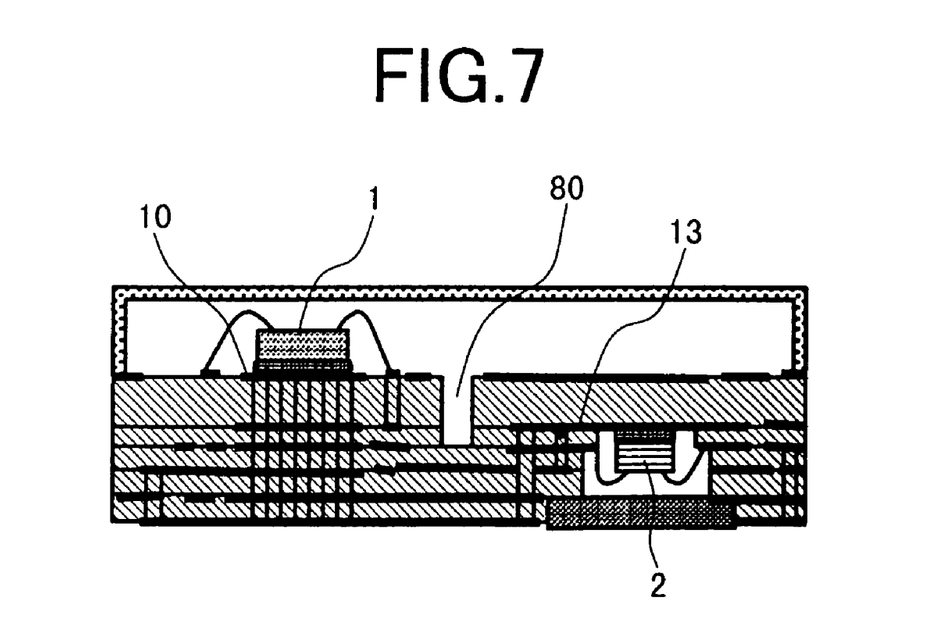
FIG. 7 is a sectional view showing a fourth embodiment of the present invention.

Next, a fourth embodiment of the present invention is described, referring to FIG. 7. FIG. 7 is a sectional view showing the fourth embodiment. The structure of the radio frequency module in the fourth embodiment is the same as that in the second embodiment except that there is a groove 80 between the conductor pattern 10 holding the power amplifier 1 and the conductor pattern 13 holding the SAW device 2. The groove 80 decreases the amount of heat to be conducted horizontally. As a consequence, the influence of the heat generated by the power amplifier 1 on the SAW device 2 is reduced so it is possible to provide a radio frequency module which allows the SAW device 2 to operate with stability even when both the devices are densely integrated in the substrate.

Figure 8:
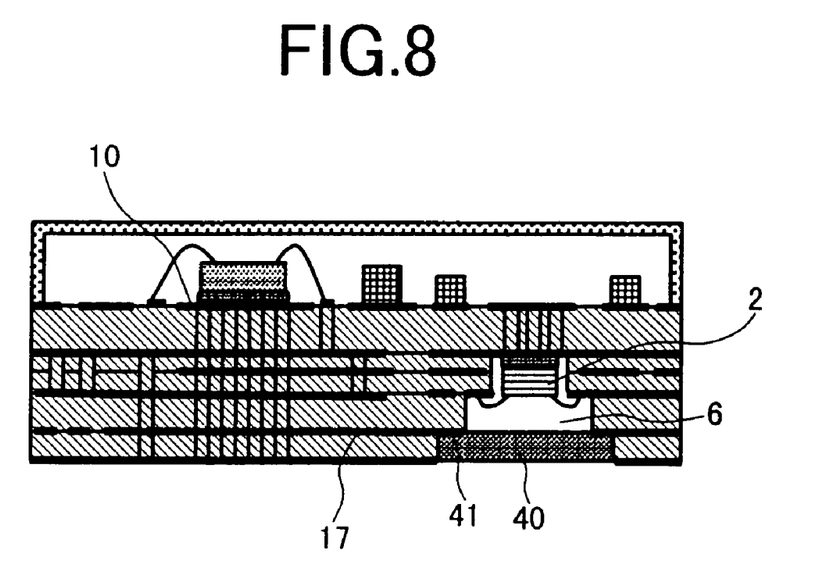
FIG. 8 is a sectional view showing a fifth embodiment of the present invention.

Next, a fifth embodiment of the present invention is described, referring to FIG. 8. FIG. 8 is a sectional view showing the fifth embodiment. The structure of the radio frequency module in the fifth embodiment is the same as that in the second embodiment except that a conductor pattern 17 electrically connected with the conductor pattern 10 holding the power amplifier 1 is electrically connected with a metal lid 40 for the cavity 6 in which the SAW device 2 is located. The difference between the conductor layer 5e in the second embodiment and that in the fifth embodiment is explained below referring to FIG. 5E and FIG. 9.

Figure 9:
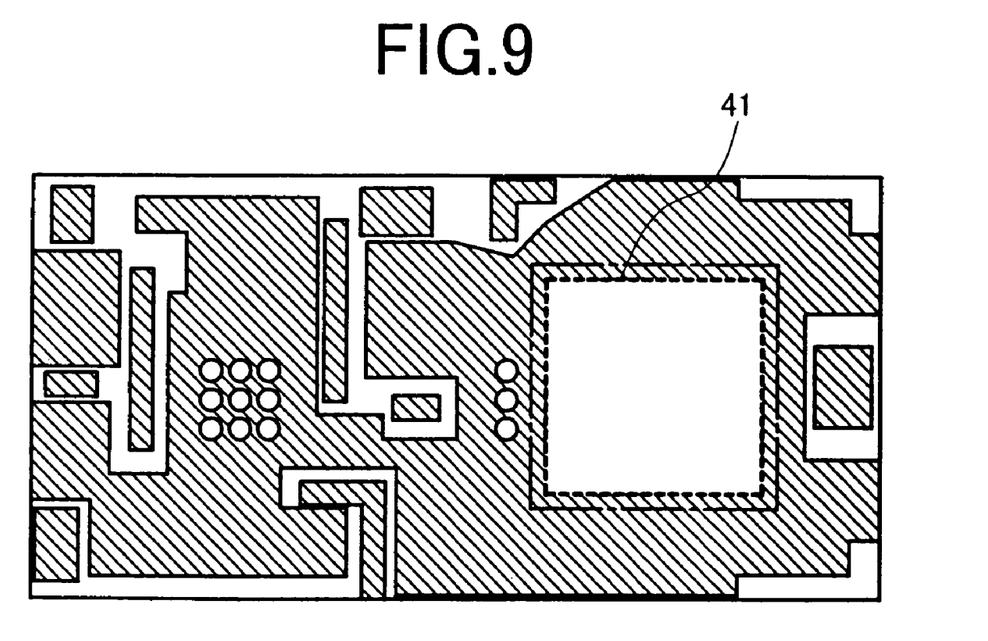
FIG. 9 is a top view showing a conductor layer pattern according to the fifth embodiment of the present invention.

FIG. 9 illustrates the conductor pattern on the conductor layer 5e in the radio frequency module according to the fifth embodiment while FIG. 5E illustrates the conductor pattern on the conductor layer 5e according to the second embodiment. In the second embodiment, an area 41 which is in contact with the metal lid 40 for the cavity 6 is not electrically connected with the conductor pattern 17 surrounding it. On the other hand, in the fifth embodiment, as shown in FIG. 9, the conductor pattern 17 is in contact with the area 41 which is in contact with the metal lid 40. As a result, since the heat from the power amplifier 1 is conducted to the metal lid 40, the heat is easier to disperse inside the radio frequency module than in the second embodiment and thus the overall temperature of the module is decreased, which leads to a decrease in the temperature of the area in which the SAW device 2 is located. Accordingly, the module structure according to this embodiment makes the temperature rise of the conductor pattern 13 holding the SAW device smaller than the module structure according to the second embodiment. As a consequence, the adoption of the same module structure as defined by this embodiment reduces the influence of the heat generated by the power amplifier 1 on the SAW device 2 so it is possible to provide a radio frequency module which allows the SAW device 2 to operate with stability even when both the devices are densely integrated in the substrate.

Figure 10:
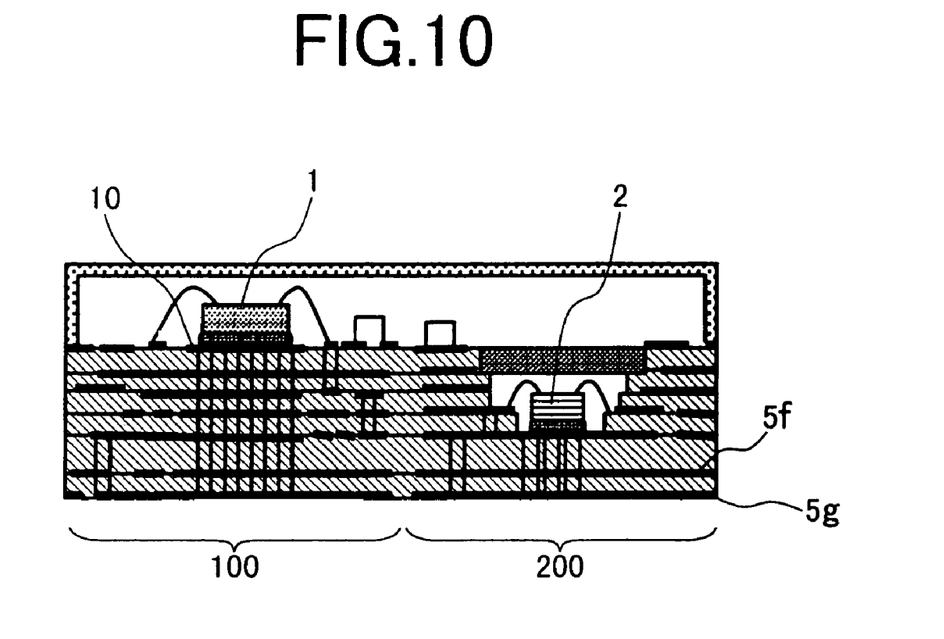
FIG. 10 is a sectional view showing a sixth embodiment of the present invention.

Next, a sixth embodiment of the present invention is described, referring to FIG. 10. FIG. 10 is a sectional view showing the sixth embodiment. The structure of the module in this embodiment is the same as that in the first embodiment except that the conductor pattern in the first area 100 and that in the second area 200 are not connected with each other at the conductor layers 5f and 5g. Thus, the conductor patterns which serve as the grounds in the first area 100 and the second area 200 are not connected at any layer, so horizontal heat conduction is smaller than in the first embodiment. This means that, although the module temperature in the first area 199 may rise a little, the amount of heat which is conducted from the power amplifier 1 to the conductor pattern 13 holding the SAW device 2 can be reduced. Consequently it is possible to provide a radio frequency module which allows the SAW device 2 to operate with stability.

Figure 11:
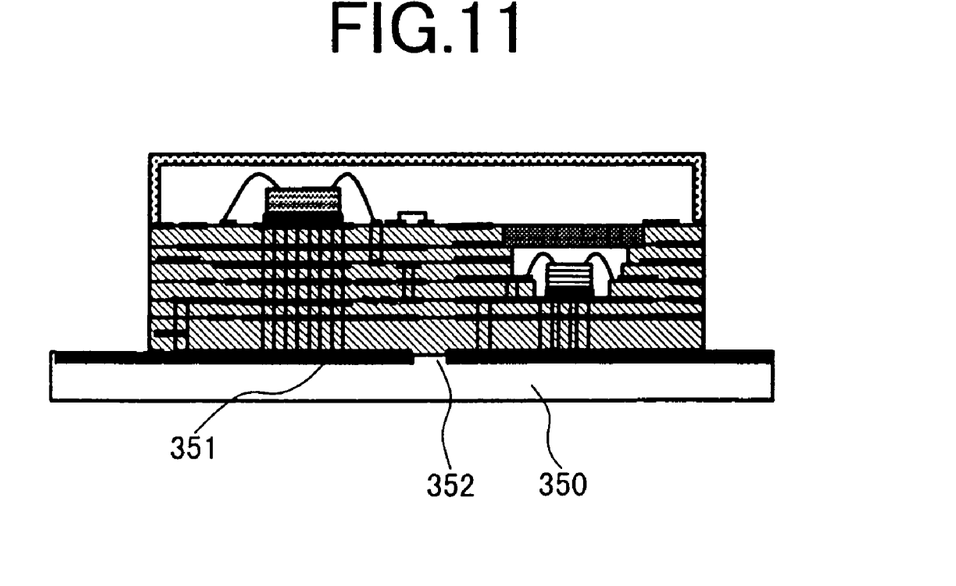
FIG. 11 is a sectional view showing a variation of the sixth embodiment of the present invention.

FIG. 11 shows a variation of the embodiment shown in FIG. 10. As can be seen from FIG. 11, in a situation that the radio frequency module according to the sixth embodiment of the present invention is mounted on a motherboard 350, a conductor-free zone 352 which fits the conductor free area between the first area 100 and the second area 200 of the radio frequency module is made in a conductor pattern 351 on the motherboard 350 so that the heat which is conducted from the first area 100 through the conductor on the motherboard 350 to the second area 200 can be reduced. Hence, it is possible to provide a radio frequency module which allows the SAW device 2 to operate with stability even when the power amplifier 1 and the SAW device 2 are densely integrated in the substrate.

Figure 12:
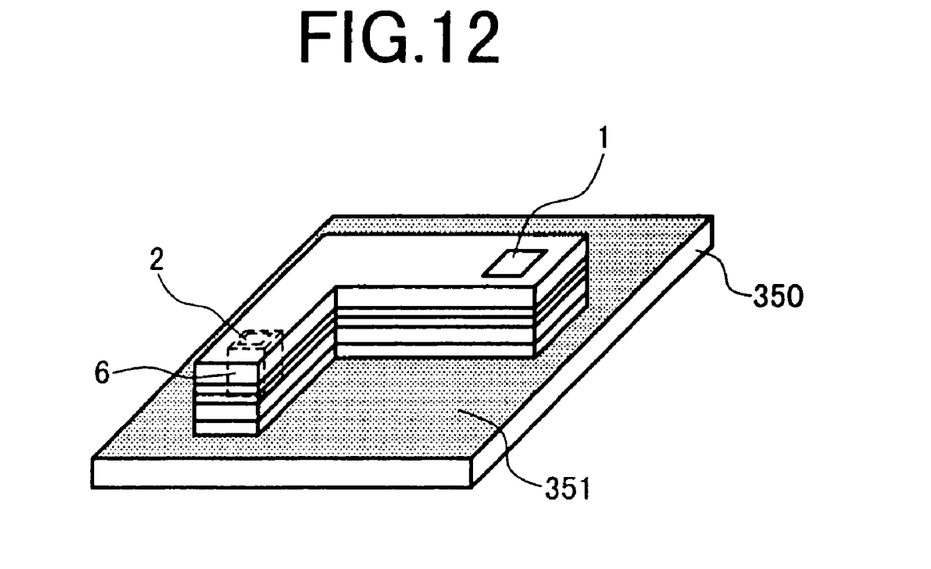
FIG. 12 is a perspective view showing a seventh embodiment of the present invention.

FIG. 12 shows a seventh embodiment of the present invention.

Figure 13:
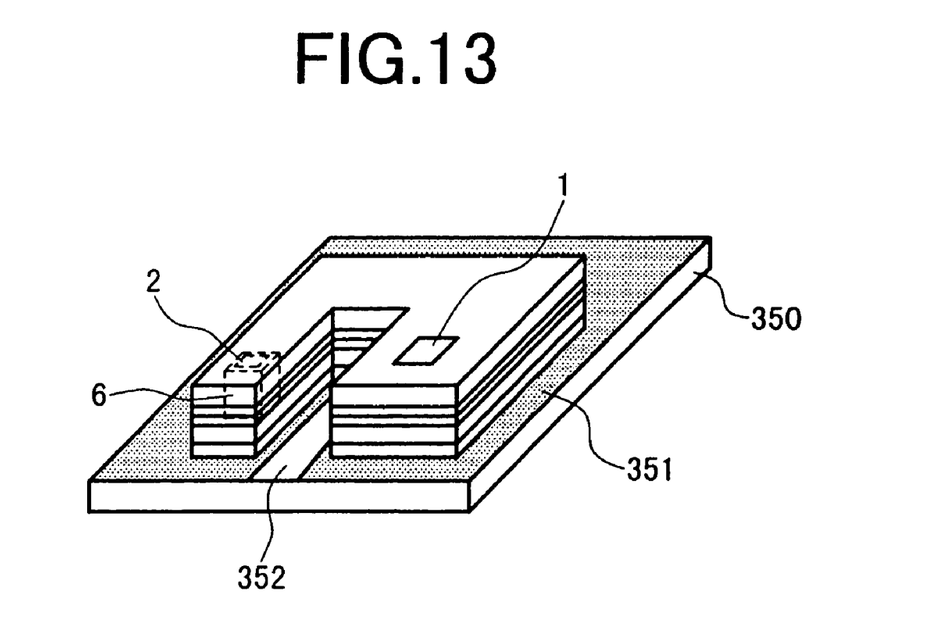
FIG. 13 is a perspective view showing an eighth embodiment of the present invention.

FIG. 13 shows an eighth embodiment of the present invention.

FIGS. 12 and 13 only show the shape of the multilayer substrate 3 and the positional relationship between the power amplifier 1 and the SAW device 2 where the conductor patterns of the radio frequency module are omitted. Here, the conductor patterns on the respective layers are much the same as those in the embodiments mentioned earlier. In these embodiments, the power amplifier 1 is located on the top face of the multilayer substrate 3 and the SAW device 2 is located inside the cavity 6 made through the bottom of the substrate 3. The multilayer substrate 3 is mounted on the motherboard 350.

In these embodiments, top view of the substrate of the radio frequency module is not rectangular but L-shaped or U-shaped and the power amplifier 1 and the SAW device 2 are located in the peripheral area of the module as illustrated in FIGS. 12 and 13. The module structures according to these embodiments make it possible to increase the distance between the power amplifier 1 and the SAW device 2 and thereby reduce heat conduction, resulting in a decrease in the temperature of the area in which the SAW device 2 is located. Part of the heat conducted to the motherboard 350 is conducted through the motherboard 350 by the conductor pattern 351. Therefore, as illustrated in FIG. 13, the conductor pattern 351 on the motherboard 350 may have a conductor-free area 352 between the SAW device 2 and the power amplifier 1.

Figure 14:
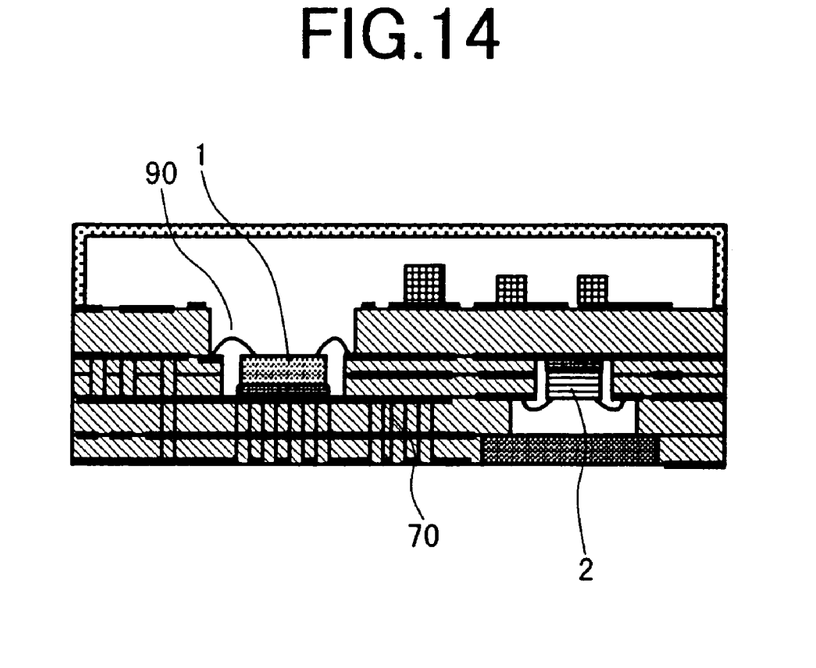
FIG. 14 is a sectional view showing a ninth embodiment of the present invention.

Referring to FIG. 14, a ninth embodiment of the present invention is explained next. The ninth embodiment is the same as the embodiments mentioned so far except that the power amplifier 1 is located inside a cavity 90 made in the multilayer substrate 3. Like the embodiment shown in FIG. 6, this embodiment has via holes 70 between the power amplifier 1 and the SAW device 2 in addition to the via holes beneath the power amplifier 1 in order to help the heat conduct towards the motherboard.

Figure 15:
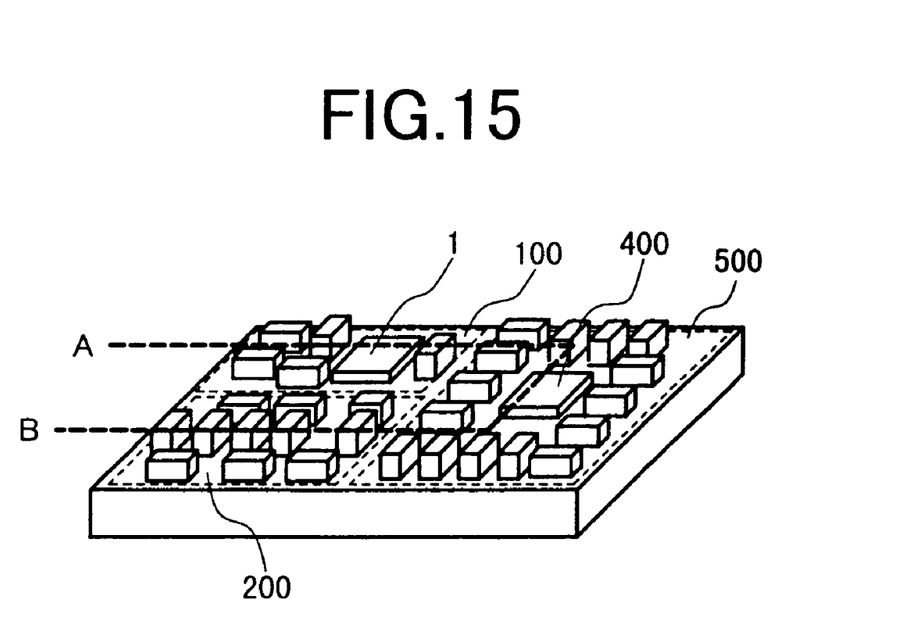
FIG. 15 is a perspective view showing a tenth embodiment of the present invention.

Referring to FIG. 15, a tenth embodiment of the present invention is explained next. FIG. 15 shows a radio frequency module which combines not only the power amplifier 1 and the SAW device but also an RF-IC 400. In FIG. 15, the SAW device is located in a cavity (not shown). This embodiment has different areas with different functions: a first area 100 which includes the power amplifier 1 and components of a matching circuit for the power amplifier; a second area 200 which includes filter components such as a SAW device, switch, capacitance and inductor; and a third area 500 which includes an RF-IC 400 and components related to RF-IC operation.

In this case, although the conductors which serve as the grounds for the respective areas may be connected not within the multilayer substrate 3 but on the motherboard 350 as in the embodiment shown in FIG. 10, from the viewpoint of suppressing the module temperature rise caused by the heat generated by the power amplifier 1 it is desirable to use a structure that conducts the heat throughout the module by connecting conductor patterns as far as possible while at the same time preventing the heat from being conducted to the conductor pattern (not shown) holding the SAW device.

Figure 16:
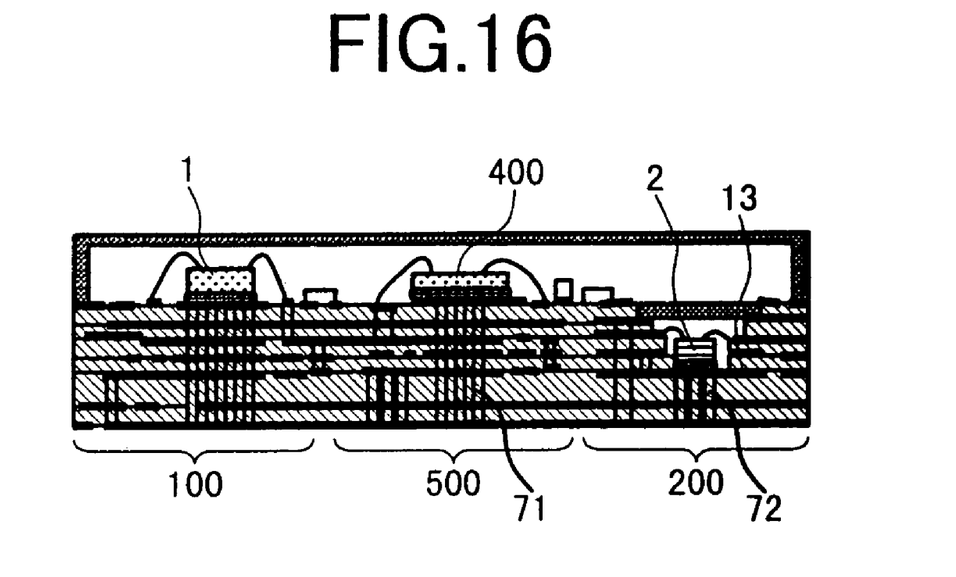
FIG. 16 is a sectional view showing the tenth embodiment of the present invention.

FIG. 16 is a sectional view taken along the dotted line A-B of FIG. 15. In the embodiment shown in FIG. 16, at the conductor layer holding the SAW device 2 and the conductor layers located above it, the conductors which serve as the grounds for the first area 100 and third area 500 are continuous with each other. In addition, via holes 71 and 72 are provided under the RF-IC chip 400 and the SAW device respectively so that the heat conducted to the third area 500 and the second area 200 is guided to the motherboard (not shown). As a consequence, the temperature rise of the conductor pattern 13 holding the SAW device 2 is suppressed and thus it is possible to provide a radio frequency module which enables the SAW device 2 to operate with stability.

Figure 17:
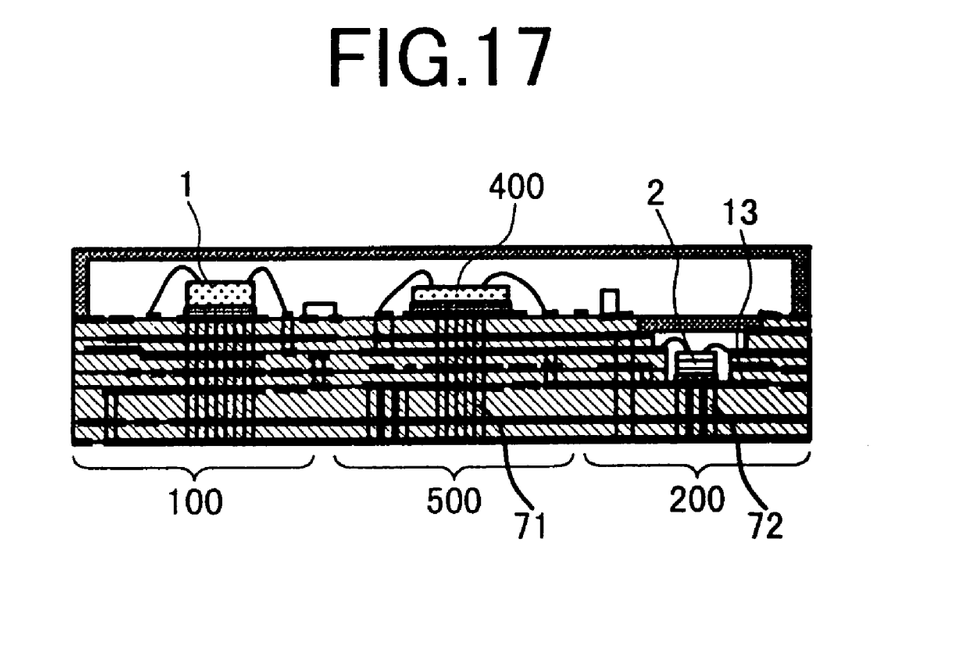
FIG. 17 is another sectional view showing the tenth embodiment of the present invention.

FIG. 17 shows another example of a radio frequency module structure. Needless to say, the radio frequency module structure is not limited to that shown in FIG. 16; it is acceptable to employ the radio frequency structure as shown in FIG. 17 in which, while the conductor patterns which serve as the grounds for the second area 200 and the third area 500 are continuous with each other, the conductor patterns in the first area 100 are not connected at the conductor layer on which the conductor pattern 13 where the SAW device 2 is mounted and the conductor layers located above that layer.

This approach, in which the power amplifier and SAW device are integrated in a module as described above, combined with a integration of a switch and an RF-IC in the module, makes it easier to design radio frequency circuit parts, requires a smaller number of man-hours for assembling, provides more handling ease and thus enables production of terminals at lower cost than the conventional method in which components are individually assembled into a terminal.

As discussed so far, the adoption of a module structure according to the present invention makes it possible to provide a more compact radio frequency module which assures more stable operation of a SAW device with no deterioration in the SAW device performance than existing radio frequency modules.

It is apparent that the present invention is not limited to a combination of a power amplifier and a SAW device and may be applied to a combination of another type of heater element and another type of device having sensitive temperature dependence of characteristics.

Furthermore, the invention may be embodied in any forms other than the above-mentioned embodiments without departing from the spirit and scope of the invention.

What is claimed is:

1. A radio frequency module for wireless communication, the radio frequency module comprising:
   a first chip forming a heater element;
   a second chip forming a device whose operating characteristics vary with temperature change or whose maximum operating temperature is lower than the maximum operating temperature of the first chip; and
   a multilayer substrate which is comprised of a plurality of dielectric layers and a plurality of conductor layers and mechanically supports the first chip and the second chip with some of the conductor layers electrically connected with the first and second chips,
   wherein the first chip is located on a first conductor pattern made on a first one of said plurality of conductor layers which is provided on the top face of the multilayer substrate or on a second one of said plurality of conductor layers which is not on the top face of the multilayer substrate;
   wherein the second chip is located on a second conductor pattern made on said first conductor layer or on a said second conductor layer;
   wherein the module has at least one of the following means: means for conducting the heat generated by the first chip throughout the module; means for guiding the heat generated by the first chip from the module's top face side to its bottom face side; and means for interrupting heat conduction from the first conductor pattern to the second conductor pattern,
   wherein the multilayer substrate is fixed on another substrate with its bottom face in contact with the other substrate; and
   wherein the means for guiding the heat generated by the first chip from the module's top face side to its bottom face side conducts the heat through via holes which at least connect the first conductor pattern and the bottom face of the module, and through via holes which connect the bottom face of the module and a part of at least one of the following conductors: a third conductor pattern electrically connected with the first conductor pattern, the second conductor pattern and a fourth conductor pattern electrically connected with the second conductor pattern.

2. The radio frequency module according to claim 1, wherein the multilayer substrate is fixed on another substrate with its bottom face in contact with the other substrate; and
wherein the means for conducting the heat generated by the first chip throughout the module conducts the heat at least through the first conductor pattern and another conductor pattern electrically connected with the first conductor pattern, and through the second conductor pattern and another conductor pattern electrically connected with the second conductor pattern.

3. The radio frequency module according to claim 1, wherein the multilayer substrate is fixed on another substrate with its bottom face in contact with the other substrate; and
wherein the first conductor pattern and a third conductor pattern electrically connected with the first conductor pattern are electrically isolated from the second conductor pattern and a fourth conductor pattern electrically connected with the second conductor pattern at least at one of the multilayer substrate conductor layers in which the first, second, third, and fourth conductor patterns are formed.

4. The radio frequency module according to claim 1, wherein the multilayer substrate is fixed on another substrate with its bottom face in contact with the other substrate; and
wherein the first conductor pattern and a third conductor pattern electrically connected with the first conductor pattern are isolated from the second conductor pattern and a fourth conductor pattern electrically connected with the second conductor pattern at the conductor layer in which the second conductor pattern is formed and conductor layers closer to the top face of the multilayer substrate than the conductor layer in which the second conductor pattern is formed.

5. The radio frequency module according to claim 4, wherein the first conductor pattern and the third conductor pattern electrically connected with the first conductor pattern are isolated from:
the second conductor pattern;
the fourth conductor pattern electrically connected with the second conductor pattern at the conductor layer in which the second conductor pattern is formed; and
conductor layers closer to the top face of the multilayer substrate than the conductor layer in which the second conductor pattern is formed, and
wherein the first and third conductor patterns are connected with the second and fourth conductor patterns at least at one of the conductor layers located closer to the bottom face of the multilayer substrate than the conductor layer in which the second conductor pattern is farmed.

6. A radio frequency module for wireless communication, the radio frequency module comprising:
a first chip forming a heater element;
a second chip forming a device whose operating characteristics vary with temperature change or whose maximum operating temperature is lower than the maximum operating temperature of the first chip, and
a multilayer substrate which is comprised of a plurality of dielectric layers and a plurality of conductor layers and mechanically supports the first chip and the second chip with some of the conductor layers electrically connected with the first and second chips, the multilayer substrate having a first surface on which the first chip is formed and a second surface on which the second chip is formed,
wherein the first chip is located on a first conductor pattern which serves as a grounding conductor for the first chip,
wherein the second chip is located on a second conductor pattern which serves as a grounding conductor for the second chip,
wherein the multilayer substrate is fixed on another substrate with its bottom face in contact with the other substrate,
wherein the first conductor pattern and a third conductor pattern electrically connected with the first conductor pattern are isolated from:
the second conductor pattern;
a fourth conductor pattern electrically connected with the second conductor pattern at the conductor layer in which the second conductor pattern is formed; and
conductor layers closer to the top face of the multilayer substrate than the conductor layer in which the second conductor pattern is formed,
wherein the first and third conductor patterns are connected with the second and fourth conductor patterns at least at one of the conductor layers located closer to the bottom face of the multilayer substrate than the conductor layer in which the second conductor pattern is formed.

7. A radio frequency module for wireless communication, the radio frequency module comprising:
a first chip forming a heater element;
a second chip forming a device whose operating characteristics vary with temperature change or whose maximum operating temperature is lower than the maximum operating temperature of the first chip; and
a multilayer substrate which mechanically supports the first chip and the second chip with some of the conductor layers electrically connected with the first and second chips, the multilayer substrate having a first surface on which the first chip is formed and a second surface on which the second chip is formed,
wherein the multilayer substrate is comprised of a lamination including a first conductor layer to an n-th conductor layer (n is an integer equal to or larger than 2) lying one upon another from the module's top to its bottom with a dielectric layer between neighboring conductor layers;
wherein the first chip is located on said first conductor layer and the second chip is located on an m-th one of said conductor layers (m is an integer which is larger than 1 and smaller than n) in a cavity made in the multilayer substrate;
wherein among first conductor patterns electrically connected with the first chip and with a grounding terminal for the module, conductor patterns formed on the first to m-th layers are not electrically connected with second conductor patterns electrically connected with the second chip and with the grounding terminal for the module at the first to m-th layers respectively; and
wherein the first conductor patterns are electrically connected with the second conductor patterns at least at one of the (m+1)th to n-th layers.

8. The radio frequency module according to claim 7, further comprising:

wherein a conductor pattern used for reception or transmission of signals between the first chip and the second chip is located on any conductor layer of the multilayer substrate.

9. The radio frequency module according to claim 7, wherein the second chip is located in a cavity made in the direction from the module's bottom to its inside and the cavity is covered by a metal plate, and the first conductor pattern is electrically connected with the metal plate.

10. The radio frequency module according to claim 7, further comprising a third chip that is lower in heat value than the first chip,
wherein a third conductor pattern which serves as a ground for the third chip is connected with one of conductor patterns including:
any of the first conductor patterns;
a fourth conductor pattern electrically connected with any of the first conductor patterns at any conductor layer of the multilayer substrate;
any of the second conductor patterns; and
a fifth conductor pattern electrically connected with any of the second conductor patterns at any conductor layer of the multilayer substrate.

11. The radio frequency module according to claim 7, wherein the radio frequency module is one of:
a module comprising a rectangular parallelepiped first multilayer substrate portion; and a rectangular parallelepiped second multilayer substrate portion which are joined at 90 degrees, taking the shape of the letter L, the first chip being located on a substrate portion corresponding to the first multilayer substrate portion, and the second chip being located on a substrate portion corresponding to the second multilayer substrate portion; and
a module comprising a rectangular parallelepiped first multilayer substrate portion; a rectangular parallelepiped second multilayer substrate portion; and a rectangular parallelepiped third multilayer substrate portion which are joined at 90 degrees in sequence, taking the shape of the letter U, the first chip being located on a substrate portion corresponding to the first multilayer substrate portion, and the second chip being located on a substrate portion corresponding to the third multilayer substrate portion.

12. The radio frequency module according to claim 7, wherein the radio frequency module is mounted on a mounting substrate having at least one conductor-free zone between the mounting substrate's conductor area corresponding to the area beneath the first conductor pattern and its conductor area corresponding to the area beneath the second conductor pattern.

13. A radio frequency module for wireless communication, the radio frequency module comprising:
a first chip which is a power amplifier;
a second chip forming a device whose operating characteristics vary with temperature change or whose maximum operating temperature is lower than the maximum operating temperature of the first chip; and
a multilayer substrate which is comprised of a plurality of dielectric layers and a plurality of conductor layers and mechanically supports the first chip and the second chip,
wherein the first chip is located on a first conductor pattern made on a first one of the plurality of conductor layers which is provided on the top face of the multilayer substrate;
wherein the second chip is located on a second conductor pattern made on the first conductor layer or on a second one of the plurality of conductor layers which is not provided on the top face of the multilayer substrate;
wherein the first conductor pattern is separated from the second conductor pattern; and
wherein the first conductor pattern is connected to the second conductor pattern via a third conductor pattern and via holes.

14. The radio frequency module for wireless communication, according to claim 13,
wherein the third conductor pattern is made on a third one of the plurality of conductor layers which is provided as a layer lower than the first conductor layer; and
wherein the first conductor pattern is connected to the third conductor pattern via a first via hole.

15. The radio frequency module for wireless communication, according to claim 14,
wherein the third conductor layer is provided as a layer lower than the first and second conductor layers; and
wherein the second conductor pattern is connected to the third conductor pattern via a second via hole.

16. The radio frequency module for wireless communication, according to claim 13,
wherein the multilayer substrate is fixed on another substrate with its bottom face in contact with the other substrate.

17. The radio frequency module for wireless communication, according to claim 13,
wherein the second chip is a SAW device.

* * * * *

UNITED STATES PATENT AND TRADEMARK OFFICE
CERTIFICATE OF CORRECTION

PATENT NO. : 7,362,576 B2
APPLICATION NO. : 11/076938
DATED : April 22, 2008
INVENTOR(S) : Takeda et al.

It is certified that error appears in the above-identified patent and that said Letters Patent is hereby corrected as shown below:

On the title page, item 63 should read:

(63) Continuation of application No. 10/302,813, filed on Nov. 25, ~~2005~~2002, now Pat. No. 6,879,488.

Replace the paragraph at col. 1, lines 3-4 with the following amended paragraph to read:

This is a continuation application of U.S. Ser. No. 10/302,813, filed Nov. 25, ~~2005~~2002 now U.S. Pat. No. 6,879,488.

Signed and Sealed this

Eighth Day of July, 2008

JON W. DUDAS
*Director of the United States Patent and Trademark Office*